(12) United States Patent
Otaguro et al.

(10) Patent No.: US 12,381,384 B2
(45) Date of Patent: Aug. 5, 2025

(54) MOTOR DRIVE CIRCUIT, MOTOR SYSTEM AND ELECTRIC DEVICE

(71) Applicant: ROHM CO., LTD., Kyoto (JP)

(72) Inventors: Yoshito Otaguro, Kyoto (JP); Ryota Kobayashi, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 295 days.

(21) Appl. No.: 17/947,958

(22) Filed: Sep. 19, 2022

(65) Prior Publication Data
US 2023/0114334 A1    Apr. 13, 2023

(30) Foreign Application Priority Data
Sep. 24, 2021 (JP) .................................. 2021155630

(51) Int. Cl.
  *H02P 3/12* (2006.01)
  *H02H 7/08* (2006.01)
  (Continued)

(52) U.S. Cl.
  CPC ............ *H02H 7/0838* (2013.01); *H02M 1/32* (2013.01); *H02P 6/28* (2016.02); *H03K 17/063* (2013.01); *H03K 17/687* (2013.01)

(58) Field of Classification Search
  CPC ...... H02P 6/14; H02P 3/12; H02P 9/02; H02P 7/04; H02P 2207/03; H02P 23/00; H02P 25/092; H02P 3/14; H02P 3/22; H02P 3/24; H02P 6/24; H02P 2201/09; H02P 7/29; H02P 6/085; H02P 6/08; H02P 29/027; H02P 6/28; H02P 2205/01; H02P 29/02;
  (Continued)

(56) References Cited

U.S. PATENT DOCUMENTS 6,225,673 B1 *   5/2001   Pendharkar ......... H01L 29/7835
                                                        257/500
2005/0067660 A1 *   3/2005   Uehara ................. H01L 21/761
                                                        257/394

FOREIGN PATENT DOCUMENTS

JP   H08-130307     5/1996
JP   2000-311953    11/2000
JP   2017-189066    10/2017

OTHER PUBLICATIONS

JP OA & SR—Japanese Patent Office, Office Action and Search Report in Japanese Appln. No. 2021-155630, dated Apr. 22, 2025, 31 pages (with English translation).

* cited by examiner

*Primary Examiner* — Kawing Chan
*Assistant Examiner* — Charles S Laughlin
(74) *Attorney, Agent, or Firm* — Fish & Richardson P.C.

(57) ABSTRACT

The present disclosure provides a motor drive circuit. The motor drive circuit includes a first-phase half bridge circuit and a second-phase half bridge circuit. The first and second phase half bridge circuits include first-phase and second-phase high-side FETs and first-phase and second-phase low-side FETs. The first-phase and second-phase high-side FETs are configured to apply a first voltage to a first end. A second end of the first-phase and second-phase high-side FETs is connected to the first end. A second voltage lower than the first voltage is applied to the second end. The first-phase low-side FET or the second-phase high-side FET is disposed between the first-phase high-side FET and the second-phase low-side FET. The second-phase low-side FET or the first-phase high-side FET is disposed between the first-phase low-side FET and the second-phase high-side FET.

21 Claims, 8 Drawing Sheets

(51) Int. Cl.
*H02M 1/32* (2007.01)
*H02P 6/28* (2016.01)
*H02P 7/29* (2016.01)
*H03K 17/06* (2006.01)
*H03K 17/687* (2006.01)

(58) Field of Classification Search
CPC .... H02P 29/40; H02P 6/17; H02P 6/20; H02P 6/26; H02P 7/2913; H02P 7/293; H02P 8/12; H02P 8/22; H02P 2201/07; H02P 25/08; H02P 27/08; H02P 27/085; H02P 29/032; H02P 25/034; H02P 27/06; H02P 6/182; H02P 6/21
See application file for complete search history.

MOTOR DRIVE CIRCUIT, MOTOR SYSTEM AND ELECTRIC DEVICE

TECHNICAL FIELD

The present disclosure relates to a notor drive circuit, a motor system and an electric device.

BACKGROUND

A motor drive circuit that uses a bridge output stage to generate a driving current of a motor has long since been used in various types of applications. A bridge output stage arranged in a motor drive circuit includes such as an H-bridge output stage and a three-phase bridge output stage.

PRIOR ART DOCUMENT

Patent Publication

[Patent document 1] Japan Patent Publication No. 2017-189066

SUMMARY

Problems to be Solved by the Disclosure

In a common motor drive circuit, to disconnect a current, that is, to switch a driving current flowing through an excitation coil of a motor from an on state to an off state, there is a concern of a latch-up effect occurring unexpectedly.

In paragraph [0076] of the patent document 1, examples of countermeasures for eliminating the latch-up effect by research designs on the layout include: (1) a layout that enlarges an inter-element distance between a first-phase high-side transistor and a second-phase low-side transistor: (ii) a layout in which an element isolation portion is buried between a first-phase high-side transistor and a second-phase low-side transistor; and (iii) a layout in which an n-type well to which a power supply voltage is applied and a p-type well to which a ground voltage is applied are formed so that a second-phase low-side transistor has a floating structure. However, the above countermeasures (i) to (iii) for eliminating the latch-up effect contain a drawback of leading to an increased mounting area.

A motor drive circuit disclosed by the present application includes a first phase half-bridge circuit and a second phase half-bridge circuit. The first phase half-bridge circuit includes: a first phase high-side field-effect transistor (FET), configured to have a first end to which a first voltage is applied; and a first phase low-side FET, configured to have a first end connected to a second end of the first phase high-side FET, a second voltage lower than the first voltage being applied to the second end. The second phase half-bridge circuit includes: a second phase high-side FET, configured to have a first end to which the first voltage is applied; and a second phase low-side FET, configured to have a first end connected to a second end of the second phase high-side FET, the second voltage being applied to the second end. The first phase low-side FET or the second phase high-side FET is disposed between the first phase high-side FET and the second phase low-side FET. The second phase low-side FET or the first phase high-side FET is disposed between the first phase low-side FET and the second phase high-side FET.

A motor system disclosed by the present application includes a motor, and the motor drive circuit configured to drive the motor of the above configuration.

An electric device disclosed by the application includes the motor system of the above configuration.

Effects of the Disclosure

In the motor drive circuit, the motor system and the electric device disclosed according to the present application, with research designs in the layout, an increase in the mounting area can be inhibited, and the latch-up effect during current disconnection can be suppressed.

DETAILED DESCRIPTION

First Embodiment

Figure 1:
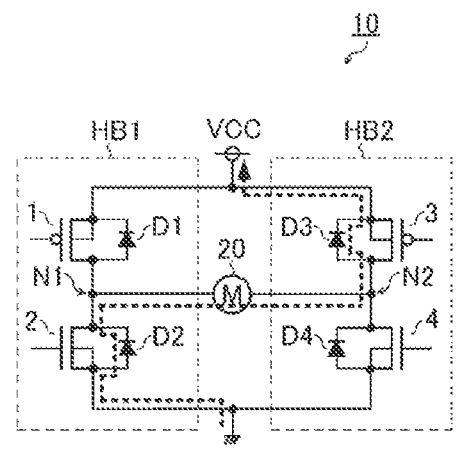
FIG. 1 is a diagram of a configuration of a motor drive circuit according to a first embodiment.

FIG. 1 shows a diagram of a configuration of a motor drive circuit 10 (to be referred to as a "motor drive circuit 10" hereafter) according to a first embodiment.

The motor drive circuit 10 includes a first phase half-bridge circuit HB1 and a second phase half-bridge circuit HB2.

The first phase half-bridge circuit HB1 includes a P-channel field-effect transistor (FET) 1 and an N-channel FET 2. The P-channel FET 1 is a first phase high-side FET, and the N-channel FET 2 is a first phase low-side FET.

A power supply voltage VCC is applied to the source and back gate of the P-channel FET 1.

The drain of the N-channel FET 2 is connected to the drain of the P-channel FET 1. A ground voltage is applied to the source and back gate of the N-channel FET 2. The ground voltage is a voltage lower than the power supply voltage VCC.

A parasitic diode D1 is formed in the P-channel FET 1. The anode of the parasitic diode D1 is connected to the drain of the P-channel FET 1, and the cathode of the parasitic diode D1 is connected to the source and back gate of the P-channel FET 1. A parasitic diode D2 is formed in the N-channel FET 2. The anode of the parasitic diode D2 is connected to the source and back gate of the N-channel FET 1, and the cathode of the parasitic diode D2 is connected to the drain of the N-channel FET 1.

The second phase half-bridge circuit HB2 includes a P-channel FET 3 and an N-channel FET 4. The P-channel FET 3 is a second phase high-side FET, and the N-channel FET 4 is a second phase low-side FET.

The power supply voltage VCC is applied to the source and back gate of the P-channel FET 3.

The drain of the N-channel FET 4 is connected to the drain of the P-channel FET 3. The ground voltage is applied to the source and back gate of the N-channel FET 4.

A parasitic diode D3 is formed in the P-channel FET 3. The anode of the parasitic diode D3 is connected to the drain of the P-channel FET 3, and the cathode of the parasitic diode D3 is connected to the source and back gate of the P-channel FET 3. A parasitic diode D4 is formed in the N-channel FET 4. The anode of the parasitic diode D4 is connected to the source and back gate of the N-channel FET 4, and the cathode of the parasitic diode D4 is connected to the drain of the N-channel FET 4.

A connecting node N1 is a connecting node of the drain of the P-channel FET 1 and the drain of the N-channel FET 2. A connecting node N2 is a connecting node of the drain of the P-channel FET 3 and the drain of the N-channel FET 4. The step motor 20 is connected between the connecting node N1 and the connecting node N2. More specifically, the step motor 20 includes a first excitation coil and a second excitation coil. A first end of the first excitation coil is connected to the connecting node N1, and a second end of the first excitation coil is connected to the connecting node N2.

When the P-channel FET 1 and the N-channel FET 4 are turned on and the P-channel FET 3 and the N-channel FET 2 are turned off, a driving current flows through the first excitation coil in a direction from the connecting node N1 to the connecting node N2. In such state, if the P-channel FET 1 and P-channel FET 3 and the N-channel FET 2 and N-channel FET 4 are turned off, the driving current continues flowing in a previous flow direction in the first excitation coil. Thus, as shown by the dotted arrow in FIG. 1, the driving current flows in a current path from the grounded application end through the parasitic diode D2, the first excitation coil and the parasitic diode D3 to the application end of the power supply voltage VCC.

Figure 2:
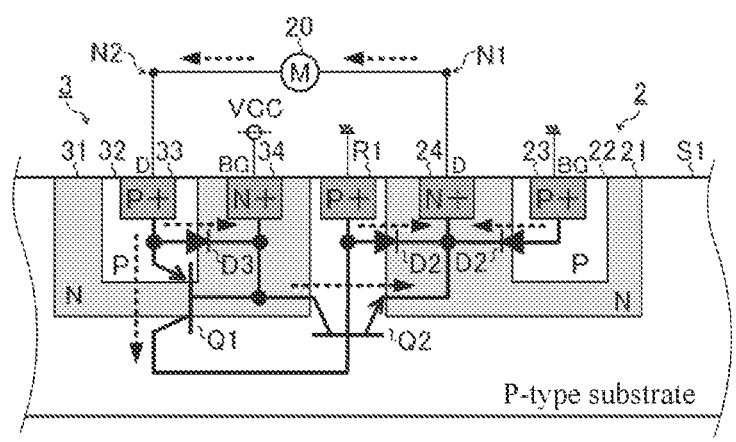
FIG. 2 is a diagram of vertical structures of an N-channel field-effect transistor (FET) and a P-channel FET.

FIG. 2 shows a diagram of vertical structures of the N-channel FET 2 and the P-channel FET 3. Moreover, FIG. 2 depicts parts relevant to parasitic diodes and parasitic transistors, and drawings of parts irrelevant to parasitic diodes and parasitic transistors are omitted.

The N-channel FET 2 and the P-channel FET 3 are formed on a P-type semiconductor substrate S1. A high-concentration P-type region R1 is also formed on the P-type semiconductor substrate S1. The high-concentration region R1 is an application end of the ground voltage.

The N-channel FET 2 includes an N-type region 21, a P-type region 22, a high-concentration P-type region 23 and a high-concentration N-type region 24. The high-concentration P-type region 23 is the back gate of the N-channel FET 2, and the high-concentration N-type region 24 is the drain of the N-channel FET 2.

The P-channel FET 3 includes an N-type region 31, a P-type region 32, a high-concentration P-type region 33 and a high-concentration N-type region 34. The high-concentration P-type region 33 is the drain of the P-channel FET 3, and the high-concentration N-type region 34 is the back gate of the P-channel FET 3.

The parasitic diode D2 is formed by the P-type semiconductor substrate S1, the P-type region 22 and the N-type region 21, and the parasitic diode D3 is formed by the P-type region 32 and the N-type region 31. A parasitic PNP transistor Q1 is formed by the P-type region 32, the N-type region 31 and the P-type semiconductor substrate S1, and a parasitic NPN transistor Q2 is formed by the N-type region 31, the P-type semiconductor substrate S1 and the N-type region 21.

Figure 3:
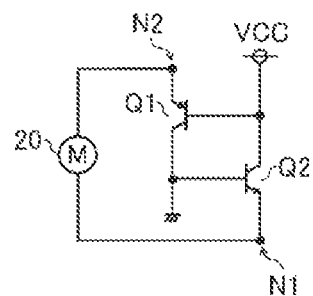
FIG. 3 is a diagram of a thyristor including a parasitic PNP transistor Q1 and a parasitic NPN transistor Q2.

Once the driving current indicated by the dotted arrow in FIG. 1 flows, the current indicated by the dotted arrow in FIG. 2 also flows. That is to say, when the driving current indicated by the dotted arrow in FIG. 1 flows, currents also flow through the parasitic PNP transistor Q1 and the parasitic transistor NPN Q2. As shown in FIG. 3, the parasitic PNP transistor Q1 and the parasitic NPN transistor Q2 form a thyristor. Thus, when gains of the parasitic PNP transistor Q1 and the parasitic NPN transistor Q2 are high, the thyristor including the parasitic PNP transistor Q1 and the parasitic NPN transistor Q2 is turned on during current disconnection, leading to a latch-up effect.

On the other hand, when the P-channel FET 1 and the N-channel FET 4 are turned off and the P-channel FET 3 and the N-channel FET 2 are turned on, a driving current flows through the first excitation coil in a direction from the connecting node N2 to the connecting node N1. In such state, if the P-channel FET 1 and P-channel FET 3 as well as the N-channel FET 2 and N-channel FET 4 are turned off, the driving current continues flowing in a previous flow direction in the first excitation coil. Thus, the driving current flows in a current path from the grounded application end through the parasitic diode D4, the first excitation coil and the parasitic diode D1 to the application end of the power supply voltage VCC.

Thus, similar to the N-channel FET 2 and the P-channel FET 3, when the gain of the parasitic transistor is high, the P-channel FET 1 and the N-channel FET 4 also cause a latch-up effect.

Moreover, in addition to the H-bridge (the first phase half-bridge circuit HB1 and the second phase half-bridge circuit HB2) for flowing the driving current through the first excitation coil of the step motor 20, the motor drive circuit 10 further includes an H-bridge for flowing the driving current through the second excitation coil of the step motor 20.

The structure of the H-bridge for flowing the driving current through the second excitation coil of the step motor 20 is the same as that of the H-bridge for flowing the driving current through the first excitation coil of the step motor 20. Moreover, the layout examples below are also applicable to an H-bridge for flowing the drive current to through the second excitation coil of the stepping motor 20.

First Layout Example

Figure 4:
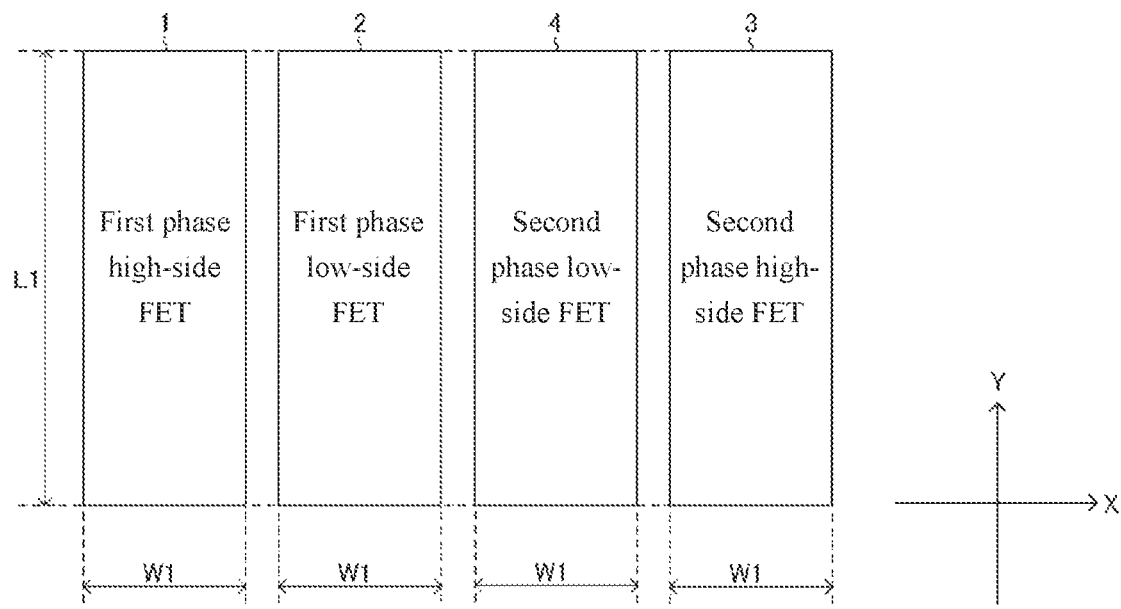
FIG. 4 is a diagram of a first layout example of P-channel FETs and N-channel FETs.

FIG. 4 shows a diagram of a first layout example of a P-channel FETs 1 and 3 and N-channel FETs 2 and 4. FIG. 4 shows a top view of a main part of a semiconductor chip mounted with the motor drive circuit 10.

In the first layout example, the second phase low-side FET 4 is disposed between the N-channel FET 2 serving as the first phase low-side FET and the P-channel FET 3 serving as the second phase high-side FET. As such, without providing an invalid space as in patent document 1, the gains of the parasitic PNP transistor Q1 and the parasitic NPN transistor Q2 shown in FIG. 2 can be reduced.

In the first layout example, the N-channel FET 2 serving as the first phase low-side FET is disposed between the P-channel FET 1 serving as the first phase high-side FET and the N-channel FET 4 serving as the second phase low-side FET. As such, without providing an invalid space as in patent document 1, the gains of the parasitic transistors can be reduced.

Thus, according to the first layout example, an increase in the mounting area can be inhibited, and the latch-up effect during current disconnection can be suppressed.

Moreover, according to the first layout example and a fourth layout to be described below, as being different from second and third layout examples to be described below, the P-channel FET 1 serving as the first phase high-side FET and the N-channel FET 2 serving as the first phase low-side FET are adjacent, and thus routing of a wiring pattern for connecting the drain of the P-channel FET 1 and the drain of the N-channel FET 2 is not needed. Similarly, according to the first layout example and a fourth layout to be described below, as being different from second and third layout examples to be described below, the P-channel FET 3 serving as the second phase high-side FET and the N-channel FET 4 serving as the second phase low-side FET are adjacent, and thus routing of a wiring pattern for connecting the drain of the P-channel FET 3 and the drain of the N-channel FET 4 is not needed.

Moreover, a length WI of each of the P-channel FETs 1 and 3 and N-channel FETs 2 and 4 in a direction in which the P-channel FETs 1 and 3 and the N-channel FETs 2 and 4 are arranged is ideally shorter than a length L1 in a direction (the Y direction) perpendicular to the X direction and a thickness direction of a substrate (the P-type semiconductor substrate S1 in this embodiment) on which the P-channel FETs 1 and 3 and the N-channel FETs 2 and 4 are formed. As such, a mounting region of the P-channel FETs 1 and 3 and the N-channel FETs 2 and 4 can be suppressed from becoming extremely narrow and elongated in the X direction. Respective lengths WI of the P-channel FETs 1 and 3 and the N-channel FETs 2 and 4 may all equal, or at least one of the lengths may be different from the others. Moreover, respective lengths L1 of the P-channel FETs 1 and 3 and the N-channel FETs 2 and 4 may all equal, or at least one of the lengths may be different from the others. Moreover, the thickness direction of the substrate can be defined as, for example, a direction perpendicular to a surface from which a doped region (a P-type region or an N-type region) formed in the substrate is exposed to an exterior of the substrate.

Figure 5:
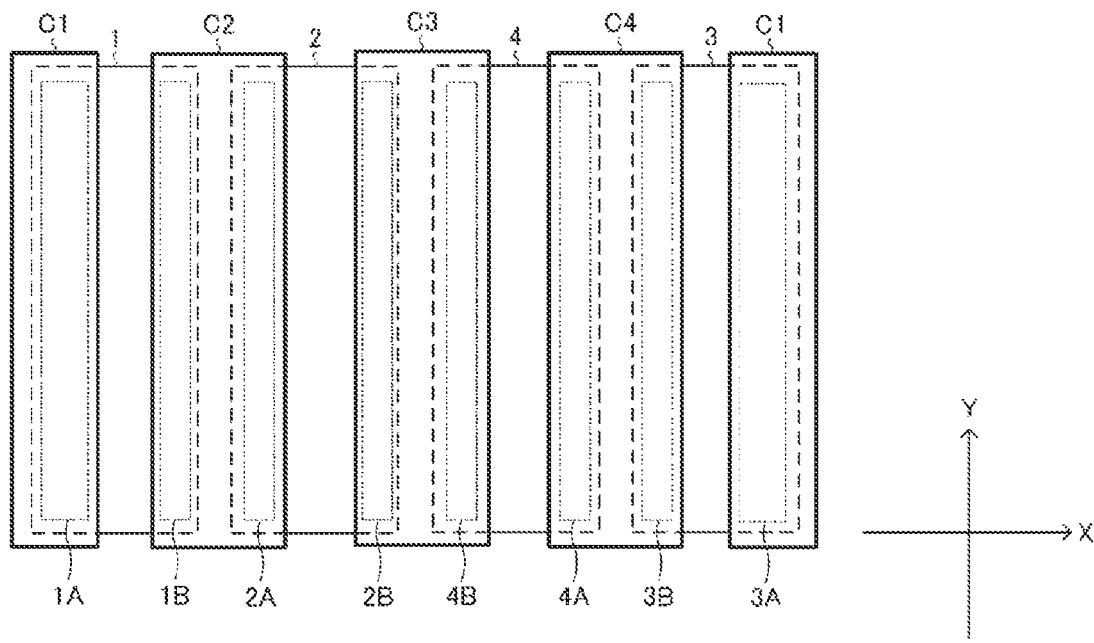
FIG. 5 is a diagram of an example of a wiring pattern in the first layout example.
Figure 6:
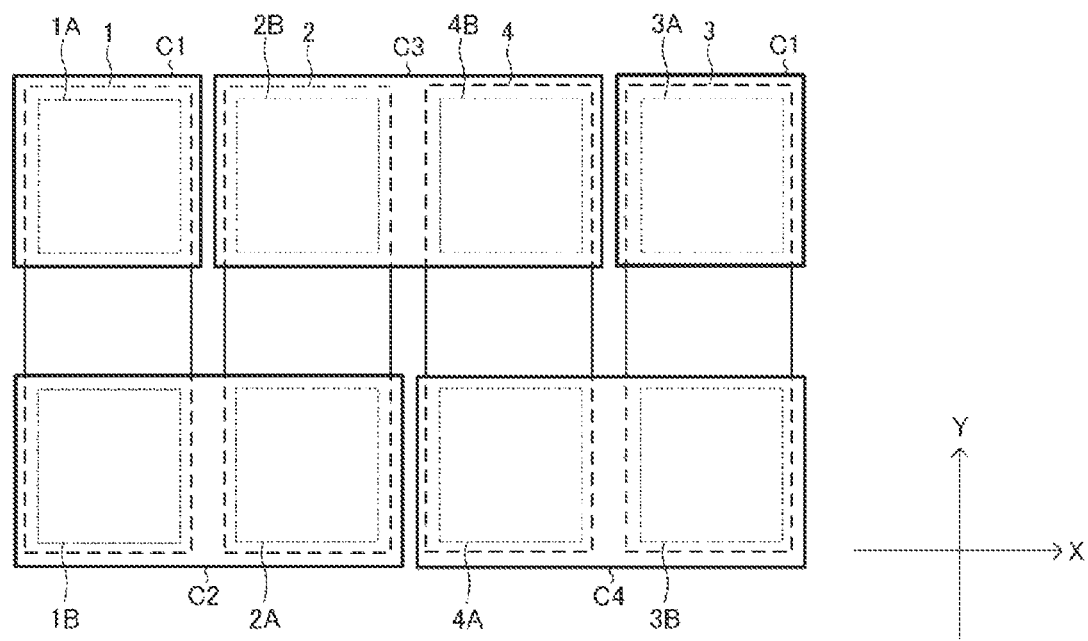
FIG. 6 is a diagram of another example of a wiring pattern in the first layout example.

FIG. 5 shows a diagram of an example of a wiring pattern in the first layout example. FIG. 6 shows a diagram of another example of a wiring pattern in the first layout example.

A first conductive portion C1 is connected to a source 1A of the P-channel FET 1 and a source 3A of the P-channel FET 3. Although the first conductive portion C1 is divided into a first region connected to the source 1A of the P-channel FET 1 and a second region connected to the source 3A of the P-channel FET 3, the first region and the second region are electrically connected to each other by a connecting wiring pattern (not shown). For example, the connecting wiring pattern is located at a position closer to one side of the Y direction than the first region and the second region, or closer to the other side of the Y direction than the first region and the second region, and extend along the X direction. A second conductive portion C2 is connected to a drain 1B of the P-channel FET 1 and a drain 2A of the N-channel FET 2. A third conductive portion C3 is connected to a source 2B of the N-channel FET 2 and a source 4B of the N-channel FET 4. A fourth conductive portion C4 is connected to a drain 3B of the P-channel FET 3 and a drain 4A of the N-channel FET 4.

In the example shown in FIG. 5, when observed from a direction (the X direction) in which the P-channel FETs 1 and 3 and the N-channel FETs 2 and 4 are formed and the direction (the Y direction) perpendicular to the thickness direction of the substrate (the P-type semiconductor substrate S1 in this embodiment) on which the P-channel FETs 1 and 3 and the N-channel FETs 2 and 4 are formed, the first to fourth conductive portions C1 to C4 do not overlap. According to the wiring pattern, the source and the drain of each FET can be easily disposed along the X direction.

In the example in FIG. 6, when observed from the Y direction, the second conductive portion C2 overlaps the first conductive portion C1 and the third conductive portion C3, the fourth conductive portion C4 overlaps the first conductive portion C1 and the third conductive portion C3, and the second conductive portion C2 and the fourth conductive portion C4 do not overlap each other. According to the wiring pattern, the source and the drain of each FET can be easily disposed along the Y direction.

Second to Fourth Layout Examples

Figure 7:
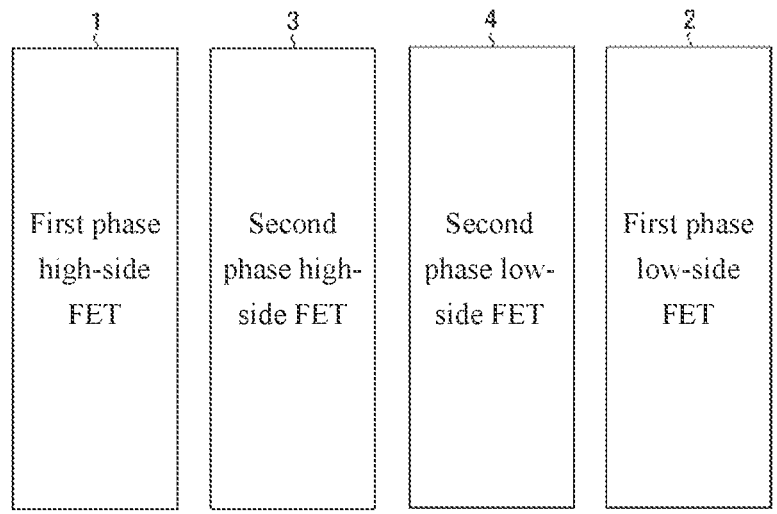
FIG. 7 is a diagram of a second layout example of P-channel FETs and N-channel FETs.
Figure 8:
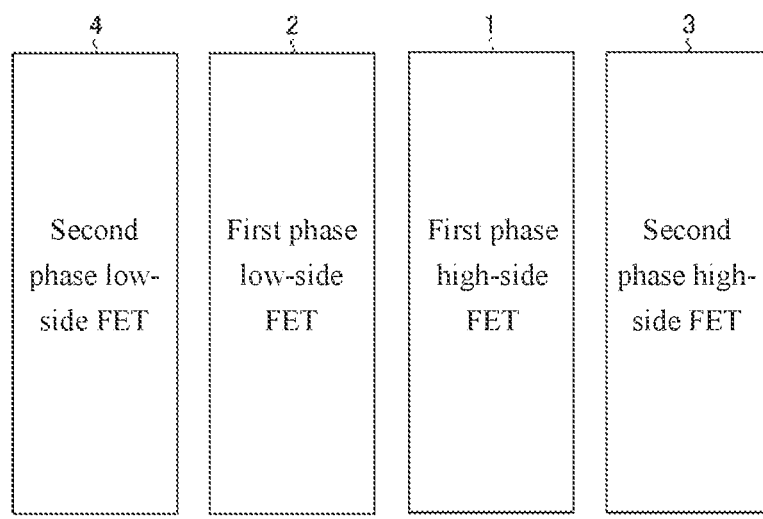
FIG. 8 is a diagram of a third layout example of P-channel FETs and N-channel FETs.
Figure 9:
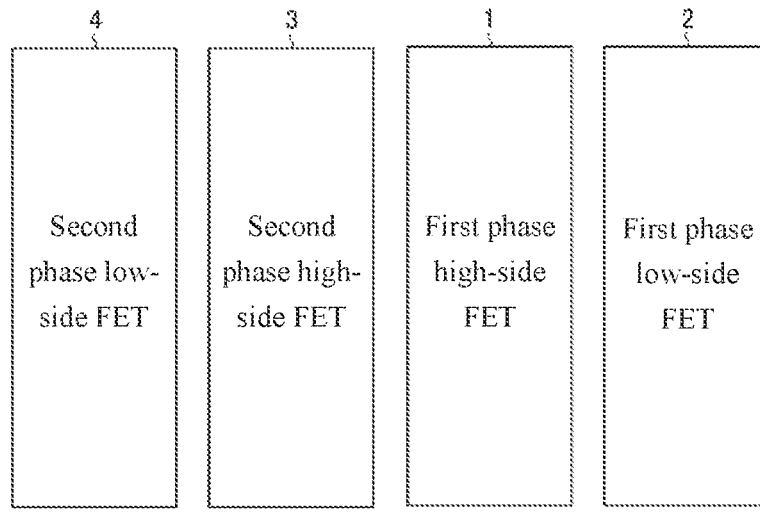
FIG. 9 is a diagram of a fourth layout example of P-channel FETs and N-channel FETs.

FIG. 7 to FIG. 9 show diagrams of second to fourth layout examples of the P-channel FETs 1 and 3 and the N-channel FETs 2 and 4.

In the second layout example shown in FIG. 7, the P-channel FET 3 serving as the second phase high-side FET is disposed between the P-channel FET 1 serving as the first phase high-side FET and the N-channel FET 4 serving as the second phase low-side FET.

Moreover, the N-channel FET 4 serving as the second phase low-side FET is disposed between the N-channel FET 2 serving as the first phase low-side FET and the P-channel FET 3 serving as the second phase high-side FET.

According to the second layout example, similar to the first layout example, an increase in the mounting area can be inhibited, and the latch-up effect during current disconnection can be suppressed.

In the third layout example shown in FIG. 8, the N-channel FET 2 serving as the first phase low-side FET is disposed between the P-channel FET 1 serving as the first phase high-side FET and the N-channel FET 4 serving as the second phase low-side FET.

Moreover, in the third layout example shown in FIG. 8, the P-channel FET 1 serving as the first phase high-side FET is disposed between the N-channel FET 2 serving as the first phase low-side FET and the P-channel FET 3 serving as the second phase high-side FET.

According to the third layout example, similar to the first layout example, an increase in the mounting area can be inhibited, and the latch-up effect during current disconnection can be suppressed.

In the fourth layout example shown in FIG. 9, the P-channel FET 3 serving as the second phase high-side FET is disposed between the P-channel FET 1 serving as the first phase high-side FET and the N-channel FET 4 serving as the second phase low-side FET.

Moreover, in the fourth layout example shown in FIG. 9, the P-channel FET 1 serving as the first phase high-side FET is disposed between the N-channel FET 2 serving as the first phase low-side FET and the P-channel FET 3 serving as the second phase high-side FET.

According to the fourth layout example, similar to the first layout example, an increase in the mounting area can be inhibited, and the latch-up effect during current disconnection can be suppressed.

Second Embodiment

Figure 10:
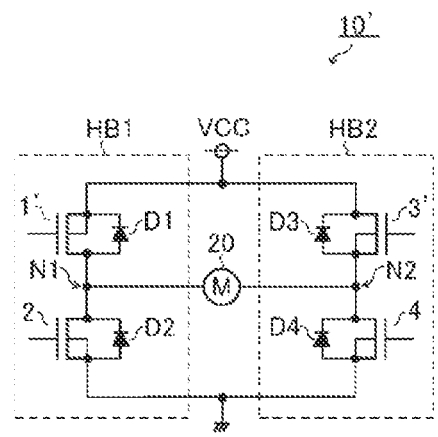
FIG. 10 is a diagram of a configuration of a motor drive circuit according to a second embodiment.

FIG. 10 shows a diagram of a configuration of a motor drive circuit 10' (to be referred to as a "motor drive circuit 10''" hereafter) according to a second embodiment.

In the motor drive circuit 10', a difference from the motor drive circuit 10 is that an N-channel FET 1' is used as the first phase high-side FET, and an N-channel FET 3' is used as the second phase high-side FET, and the other aspects are the same as those of the motor drive circuit 10.

Figure 11:
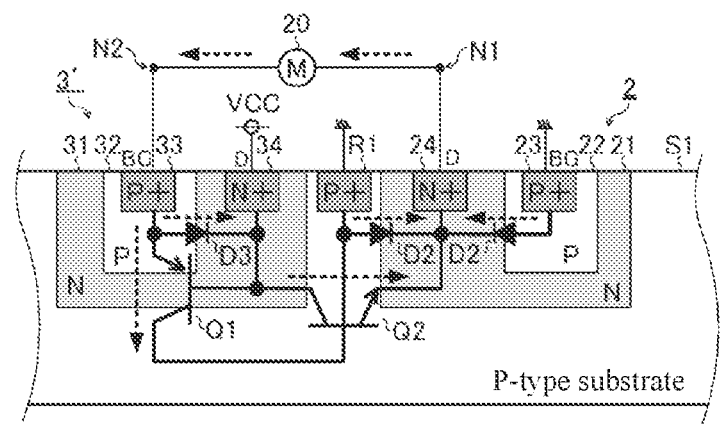
FIG. 11 is a diagram of a vertical structures of N-channel FETs.

FIG. 11 shows a diagram of vertical structures of the N-channel FET 2 and 3'. Moreover, FIG. 11 depicts parts relevant to parasitic diodes and parasitic transistors, and drawings of parts irrelevant to parasitic diodes and parasitic transistors are omitted.

Since a parasitic transistor the same as that in the motor drive circuit 10 is also formed in the motor drive circuit 10', with the layout the same as each FET in the motor drive circuit 10, an increase in the mounting area can be inhibited, and the latch-up effect during current disconnection can be suppressed.

<Motor System>

Figure 12:
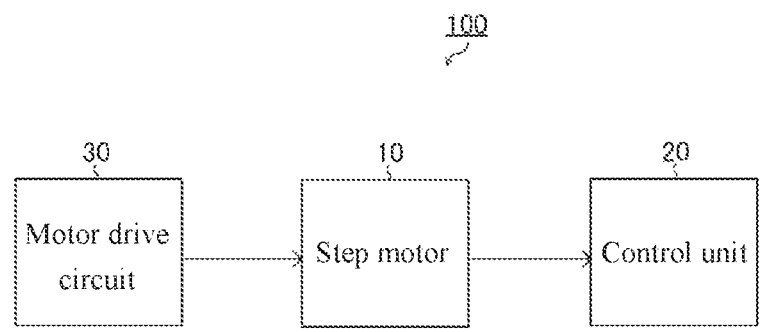
FIG. 12 is a block diagram of a motor system.

FIG. 12 shows a block diagram of a motor system. A motor system 100 shown in FIG. 12 includes the step motor 20, the motor drive circuit 10 configured to drive the step motor 20, and a control unit 30 configured to control a switch of each FET in the motor drive circuit 10. Moreover, the motor drive circuit 10' may also be used in substitution for the motor drive circuit 10.

<Electric Device>

Figure 13:
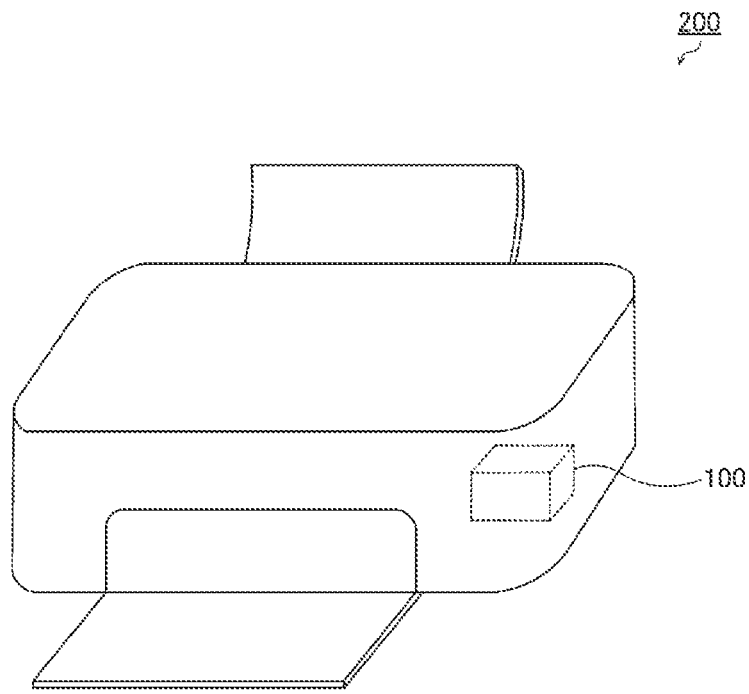
FIG. 13 is a perspective diagram of an appearance of a printer.

The motor system 100 is, for example, built in a printer 200 shown in FIG. 13, as a part of a paper conveying mechanism. Moreover, the motor system 100 may also be equipped with an electric device other than a printer.

Notes

In addition to the embodiments, various modifications may be applied to the configurations of the present disclosure without departing from the scope of the inventive subject thereof. It should be understood that all aspects of the embodiment are exemplary rather than restrictive, and it should also be understood that the technical scope of the present disclosure is represented by way of the claims but not the non-limiting embodiments, including all variations made within equivalent meanings and scopes accorded with the claims.

In the embodiment, a motor drive circuit drives a step motor having a first excitation coil and a second excitation coil; however, the motor drive circuit may also drive a motor other than the step motor.

Figure 14:
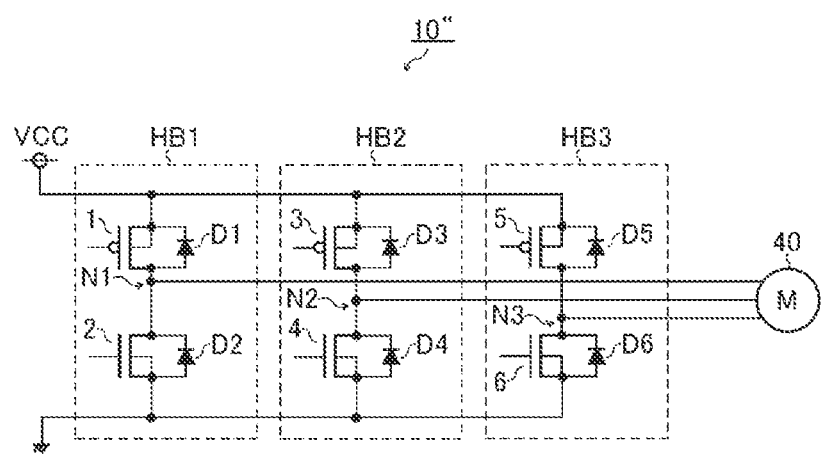
FIG. 14 is a diagram of a configuration of a motor drive circuit according to a variation example.

The motor drive circuit 10" of the variation example shown in FIG. 14 drives a three-phase brushless motor 40. In addition to the first phase half-bridge circuit HB1 and the second phase half-bridge circuit HB2, the motor drive circuit 10" of the variation example further includes a third phase half-bridge circuit HB3. The third phase half-bridge circuit HB3 includes a P-channel FET 5 and an N-channel FET 6. The P-channel FET 5 is a third phase high-side FET, and the N-channel FET 6 is a third phase low-side FET.

A parasitic diode D5 is formed in the P-channel FET 5. A parasitic diode D6 is formed in the N-channel FET 6.

Figure 15:
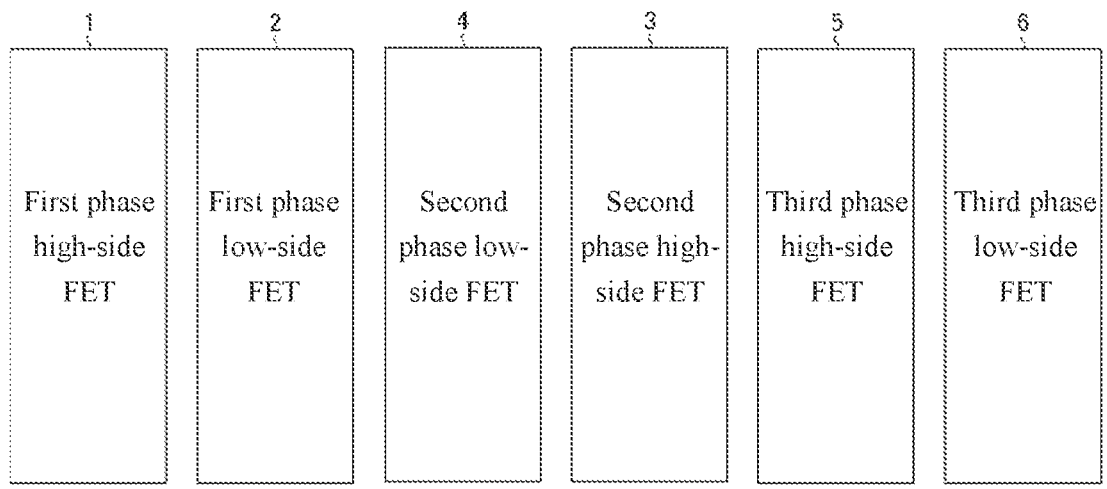
FIG. 15 is a diagram of a layout example of P-channel FETs and N-channel FETs.

In the motor drive circuit 10" of the variation example, as shown in FIG. 15, the first phase high-side FET, the first phase low-side FET, the second phase high-side FET and the second phase low-side FET have configurations the same as the first layout, more specifically, the P-channel FET 5 serving as the third phase high-side FET is disposed between the P-channel FET 3 serving as the second phase high-side FET and the N-channel FET 6 serving as the third phase low-side FET.

The motor drive circuit (10, 10', 10") described above is configured as below (first configuration), that is, including a first phase half-bridge circuit (HB1) and a second phase half-bridge circuit (HB2). The first phase half-bridge circuit includes: a first phase high-side FET (1, 1'), configured to have a first end to which a first voltage is applied; and a first phase low-side FET (2), configured to have a first end connected to a second end of the first phase high-side FET, wherein a second voltage lower than the first voltage is applied to the second end. The second phase half-bridge circuit includes: a second phase high-side FET (3, 3'), configured to have a first end to which the first voltage is applied; and a second phase low-side FET (4), configured to have a first end connected to a second end of the second phase high-side FET, wherein the second voltage is applied to the second end. The first phase low-side FET or the second phase high-side FET is disposed between the first phase high-side FET and the second phase low-side FET, and the second phase low-side FET or the first phase high-side FET is disposed between the first phase low-side FET and the second phase high-side FET.

In the motor drive circuit of the first configuration, an increase in the mounting area can be inhibited, and the latch-up effect during current disconnection can be suppressed.

The motor drive circuit of the first configuration may also be configured as below (second configuration), that is, wherein the first phase low-side FET is disposed between the first phase high-side FET and the second phase low-side FET.

In the motor drive circuit of the second configuration, routing of a wiring pattern that connects the drain of the first phase high-side FET and the drain of the first phase low-side FET is no longer needed, and routing of a wiring pattern that connects the drain of the second phase high-side FET and the drain of the second phase low-side FET is no longer needed.

The motor drive circuit of the second configuration may also be configured as below (third configuration), that is, including: a first conductive portion, configured to be connected to the first end of the first phase high-side FET and the first end of the second phase high-side FET; a second conductive portion, configured to be connected to the second end of the first phase high-side FET and the first end of the first phase low-side FET; a third conductive portion, configured to be connected to a second end of the first phase low-side FET and a second end of the second phase low-side FET; and a fourth conductive portion, configured to be connected to the second end of the second phase high-side FET and the first end of the second phase low-side FET. When viewed from a direction perpendicular to a direction in which the first phase high-side FET, the first phase low-side FET, the second phase low-side FET and the second-phase high-side FET are arranged and a thickness direction of a substrate on which the first phase high-side FET, the first phase low-side FET, the second phase low-side FET and the second phase high-side FET are formed, the first conductive portion, the second conductive portion, the third conductive portion and the fourth conductive portion do not overlap.

In the motor drive circuit of the third configuration, the first end and the second end of each FET can be easily disposed in the direction in which each FET is arranged.

The motor drive circuit of the second configuration may also be configured as below (fourth configuration), that is, including: a first conductive portion, configured to be connected to the first end of the first phase high-side FET and the first end of the second phase high-side FET; a second conductive portion, configured to be connected to the second end of the first phase high-side FET and the first end of the first phase low-side FET; a third conductive portion, configured to be connected to a second end of the first phase low-side FET and a second end of the second phase low-side FET; and a fourth conductive portion, configured to be connected to the second end of the second phase high-side FET and the first end of the second phase low-side FET. When viewed from a direction perpendicular to a direction in which the first phase high-side FET, the first phase low-side FET, the second phase low-side FET and the second-phase high-side FET are arranged and a thickness direction of a substrate on which the first phase high-side FET, the first phase low-side FET, the second phase low-side FET and the second phase high-side FET are formed, the second conductive portion overlaps the first conductive portion and the third conductive portion, the fourth conductive portion overlaps the first conductive portion and the third conductive portion, and the second conductive portion and the fourth conductive portion do not overlap each other.

In the motor drive circuit of the fourth configuration, the first end and the second end of each FET can be easily disposed in a direction at a right angle to the direction in which each FET is arranged.

The motor drive circuit of any one of the first to fourth configurations may also be configured as below (fifth configuration), that is, wherein a length of each of the first phase high-side FET, the first phase low-side FET, the second phase high-side FET and the second phase low-side FET along a direction that the first phase high-side FET, the first phase low-side FET, the second phase high-side FET and the second phase low-side FET are arranged is less than a length of the first phase high-side FET, the first phase low-side FET, the second phase high-side FET and the second phase low-side FET perpendicular to the direction and a thickness direction of a substrate on which the first phase high-side FET, the first phase low-side FET, the second phase high-side FET and the second phase low-side FET are formed.

In the motor drive circuit of the fifth configuration, the mounting region of the first phase high-side FET, the first phase low-side FET, the second phase high-side FET and the second phase low-side FET can be suppressed from becoming extremely narrow and elongated in the direction in which the first phase high-side FET, the first phase low-side FET, the second phase high-side FET and the second phase low-side FET are arranged.

The motor system (100) of the description above is configured as below (sixth configuration), that is, including a motor (20), and the motor drive circuit of any one of the first to fifth configurations configured to drive the motor.

In the motor system of the sixth configuration, an increase in the mounting area of the motor drive circuit can be inhibited, and the latch-up effect during current disconnection can be suppressed.

The electric device (200) of the description above is configured as below (seventh configuration), that is, including the motor system of the sixth configuration.

In the electric device of the seventh configuration, an increase in the mounting area of the motor drive circuit can be inhibited, and the latch-up effect during current disconnection can be suppressed.

The invention claimed is:

1. A motor drive circuit, comprising:
a first phase half-bridge circuit; and
a second phase half-bridge circuit, wherein
the first phase half-bridge circuit includes:
a first phase high-side FET, configured to have a source to which a first voltage is applied; and
a first phase low-side FET, configured to have a drain connected to a drain of the first phase high-side FET, and a second voltage lower than the first voltage is applied to a source of the first phase low-side FET,
the second phase half-bridge circuit includes:
a second phase high-side FET, configured to have a source to which the first voltage is applied; and
a second phase low-side FET, configured to have a drain connected to a drain of the second phase high-side FET, and the second voltage is applied to a source of the second phase low-side FET,
the first phase low-side FET or the second phase high-side FET is disposed between the first phase high-side FET and the second phase low-side FET, and
the second phase low-side FET or the first phase high-side FET is disposed between the first phase low-side FET and the second phase high-side FET.

2. The motor drive circuit of claim 1, wherein the first phase low-side FET is disposed between the first phase high-side FET and the second phase low-side FET.

3. The motor drive circuit of claim 2, further comprising:
a first conductive portion, configured to be connected to the source of the first phase high-side FET and the source of the second phase high-side FET;
a second conductive portion, configured to be connected to the drain of the first phase high-side FET and the drain of the first phase low-side FET;
a third conductive portion, configured to be connected to the source of the first phase low-side FET and the source of the second phase low-side FET; and
a fourth conductive portion, configured to be connected to the drain second end of the second phase high-side FET and the drain of the second phase low-side FET, wherein
when viewed from a direction perpendicular to a direction in which the first phase high-side FET, the first phase low-side FET, the second phase low-side FET and the second phase high-side FET are arranged and a thickness direction of a substrate on which the first phase high-side FET, the first phase low-side FET, the second phase low-side FET and the second phase high-side FET are formed, the first conductive portion, the second conductive portion, the third conductive portion and the fourth conductive portion do not overlap.

4. The motor drive circuit of claim 2, further comprising:
a first conductive portion, configured to be connected to the source of the first phase high-side FET and the source of the second phase high-side FET;
a second conductive portion, configured to be connected to the drain of the first phase high-side FET and the drain of the first phase low-side FET;
a third conductive portion, configured to be connected to the source of the first phase low-side FET and the source of the second phase low-side FET; and
a fourth conductive portion, configured to be connected to the drain of the second phase high-side FET and the drain of the second phase low-side FET, wherein
when viewed from a direction perpendicular to a direction in which the first phase high-side FET, the first phase low-side FET, the second phase low-side FET and the second phase high-side FET are arranged and a thickness direction of a substrate on which the first phase high-side FET, the first phase low-side FET, the second phase low-side FET and the second phase high-side FET are formed,
the second conductive portion overlaps the first conductive portion and the third conductive portion,
the fourth conductive portion overlaps the first conductive portion and the third conductive portion, and
the second conductive portion and the fourth conductive portion do not overlap each other.

5. The motor drive circuit of claim 1, wherein
a length of each of the first phase high-side FET, the first phase low-side FET, the second phase high-side FET and the second phase low-side FET along a direction that the first phase high-side FET, the first phase low-side FET, the second phase high-side FET and the second phase low-side FET are arranged
is less than
a length of the first phase high-side FET, the first phase low-side FET, the second phase high-side FET and the second phase low-side FET perpendicular to the direction and a thickness direction of a substrate on which the first phase high-side FET, the first phase low-side FET, the second phase high-side FET and the second phase low-side FET are formed.

6. The motor drive circuit of claim 2, wherein
a length of each of the first phase high-side FET, the first phase low-side FET, the second phase high-side FET and the second phase low-side FET along a direction that the first phase high-side FET, the first phase low-side FET, the second phase high-side FET and the second phase low-side FET are arranged
is less than
a length of the first phase high-side FET, the first phase low-side FET, the second phase high-side FET and the second phase low-side FET perpendicular to the direction and a thickness direction of a substrate on which the first phase high-side FET, the first phase low-side FET, the second phase high-side FET and the second phase low-side FET are formed.

7. The motor drive circuit of claim 3, wherein
a length of each of the first phase high-side FET, the first phase low-side FET, the second phase high-side FET and the second phase low-side FET along a direction that the first phase high-side FET, the first phase low-side FET, the second phase high-side FET and the second phase low-side FET are arranged
is less than
a length of the first phase high-side FET, the first phase low-side FET, the second phase high-side FET and the second phase low-side FET perpendicular to the direction and a thickness direction of a substrate on which the first phase high-side FET, the first phase low-side FET, the second phase high-side FET and the second phase low-side FET are formed.

8. The motor drive circuit of claim 4, wherein
a length of each of the first phase high-side FET, the first phase low-side FET, the second phase high-side FET and the second phase low-side FET along a direction that the first phase high-side FET, the first phase low-side FET, the second phase high-side FET and the second phase low-side FET are arranged
is less than
a length of the first phase high-side FET, the first phase low-side FET, the second phase high-side FET and the second phase low-side FET perpendicular to the direction and a thickness direction of a substrate on which the first phase high-side FET, the first phase low-side FET, the second phase high-side FET and the second phase low-side FET are formed.

9. A motor system, comprising:
a motor; and
a motor drive circuit of claim 1, configured to drive the motor.

10. A motor system, comprising:
a motor; and
a motor drive circuit of claim 2, configured to drive the motor.

11. A motor system, comprising:
a motor; and
a motor drive circuit of claim 3, configured to drive the motor.

12. A motor system, comprising:
a motor; and
a motor drive circuit of claim 4, configured to drive the motor.

13. A motor system, comprising:
a motor; and
a motor drive circuit of claim 5, configured to drive the motor.

14. A motor system, comprising:
a motor; and
a motor drive circuit of claim 6, configured to drive the motor.

15. A motor system, comprising:
a motor; and
a motor drive circuit of claim 7, configured to drive the motor.

16. A motor system, comprising:
a motor; and
a motor drive circuit of claim 8, configured to drive the motor.

17. An electric device, comprising the motor system of claim 9.

18. An electric device, comprising the motor system of claim 10.

19. An electric device, comprising the motor system of claim 11.

20. An electric device, comprising the motor system of claim 12.

21. A motor drive circuit, comprising:
a first phase half-bridge circuit;
a second phase half-bridge circuit, wherein the first phase half-bridge circuit includes:
a first phase high-side FET, configured to have a first end to which a first voltage is applied; and a first phase low-side FET, configured to have a first end connected to a second end of the first phase high-side FET, and a second voltage lower than the first voltage is applied to the second end of the first phase low-side FET, the second phase half-bridge circuit includes:
  a second phase high-side FET, configured to have a first end to which the first voltage is applied; and
  a second phase low-side FET, configured to have a first end connected to a second end of the second phase high-side FET, and the second voltage is applied to the second end of the second phase low-side FET, and the first phase low-side FET or the second phase high-side FET is disposed between the first phase high-side FET and the second phase low-side FET, and the second phase low-side FET or the first phase high-side FET is disposed between the first phase low-side FET and the second phase high-side FET;

a first conductive portion, configured to be connected to the first end of the first phase high-side FET and the first end of the second phase high-side FET;

a second conductive portion, configured to be connected to the second end of the first phase high-side FET and the first end of the first phase low-side FET;

a third conductive portion, configured to be connected to the second end of the first phase low-side FET and the second end of the second phase low-side FET; and a fourth conductive portion, configured to be connected to the second end of the second phase high-side FET and the first end of the second phase low-side FET, wherein when viewed from a direction perpendicular to a direction in which the first phase high-side FET, the first phase low-side FET, the second phase low-side FET and the second phase high-side FET are arranged and a thickness direction of a substrate on which the first phase high-side FET, the first phase low-side FET, the second phase low-side FET and the second phase high-side FET are formed, the second conductive portion overlaps the first conductive portion and the third conductive portion, the fourth conductive portion overlaps the first conductive portion and the third conductive portion, and the second conductive portion and the fourth conductive portion do not overlap each other.

\* \* \* \* \*